United States Patent
Nomura et al.

(10) Patent No.: US 7,332,858 B2
(45) Date of Patent: Feb. 19, 2008

(54) LIGHT EMITTING DEVICE

(75) Inventors: Ryoji Nomura, Kanagawa (JP); Hiroko Abe, Tokyo (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 318 days.

(21) Appl. No.: 10/839,719

(22) Filed: May 6, 2004

(65) Prior Publication Data

US 2005/0001543 A1  Jan. 6, 2005

(30) Foreign Application Priority Data

May 13, 2003  (JP) ............... 2003-133950

(51) Int. Cl.
*H05B 33/00*  (2006.01)

(52) U.S. Cl. .............. 313/504; 313/506; 428/917

(58) Field of Classification Search ......... 313/503–512
See application file for complete search history.

(56) References Cited

U.S. PATENT DOCUMENTS

| | | | |
|---|---|---|---|
| 4,356,429 | A | 10/1982 | Tang |
| 4,534,743 | A | 8/1985 | D'Onofrio et al. |
| 5,048,933 | A | 9/1991 | Asano |
| 5,748,271 | A | 5/1998 | Hikmet et al. |
| 5,929,561 | A | 7/1999 | Kawami et al. |
| 5,999,241 | A | 12/1999 | Nishi et al. |
| 6,275,277 | B1 | 8/2001 | Walker et al. |
| 2002/0051112 | A1 | 5/2002 | Katsura |
| 2002/0061418 | A1* | 5/2002 | Imanishi ............... 428/690 |
| 2002/0071963 | A1* | 6/2002 | Fujii .................... 428/690 |
| 2002/0110940 | A1 | 8/2002 | Yamagata et al. |
| 2002/0113248 | A1 | 8/2002 | Yamagata et al. |
| 2003/0201443 | A1 | 10/2003 | Yamagata et al. |
| 2005/0052123 | A1 | 3/2005 | Suzuki et al. |

FOREIGN PATENT DOCUMENTS

| | | |
|---|---|---|
| JP | 9-097679 | 4/1997 |
| JP | 09-245965 | 9/1997 |
| JP | 2002-110363 | 4/2002 |
| JP | 3408154 | 3/2003 |
| JP | 3408154 | 5/2003 |

OTHER PUBLICATIONS

Era et al., "Polarized Electroluminescence From Oriented P-Sexiphenyl Vacuum-Deposited Film," *Applied Physics Letters*, vol. 67, No. 17, Oct. 23, 1995, pp. 2436-2438.

(Continued)

*Primary Examiner*—Ashok Patel
(74) *Attorney, Agent, or Firm*—Fish & Richardson P.C.

(57) ABSTRACT

A light emitting element containing an organic compound has a defect that the light emitting element is easily deteriorated by various factors; therefore, it is the biggest issue of the light emitting element that the light emitting element is formed with high reliability (longer lifetime). An objective of the present invention is to reduce or eliminate generation of the above described various defective modes of the light emitting element containing an organic compound. According to the present invention, current efficiency-luminance characteristics can be improved by orienting organic compound molecules in an applying direction of current. In addition, deterioration can be prevented by using a crystallization inhibitor.

20 Claims, 9 Drawing Sheets

OTHER PUBLICATIONS

Exhibition of Active Matrix Type Organic El Display at "13th Flat Panel Display Manufacturing Technology Expo & Conference" by ELDis Group (*in Japanese with full translation*); Jul, 2, 2003.
Documents distributed in the "13th Flat Panel Display Manufacturing Technology Expo & Conference" by ELDis Group (5 pages).

"Two-way display developed"; *The Japan Times;* (1 page); Jul. 3, 2003.
"Mass Production of Organic EL Devices"; *Shimotsuke Newspaper* (*in Japanese with full translation* ); Jul. 3, 2003.

* cited by examiner (M=Sn,In)

(M=Sn,In)

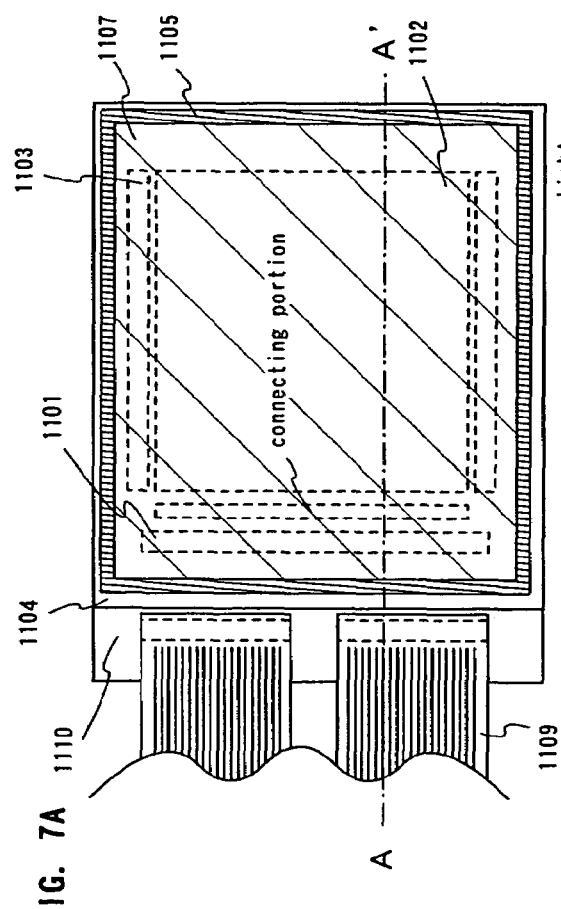
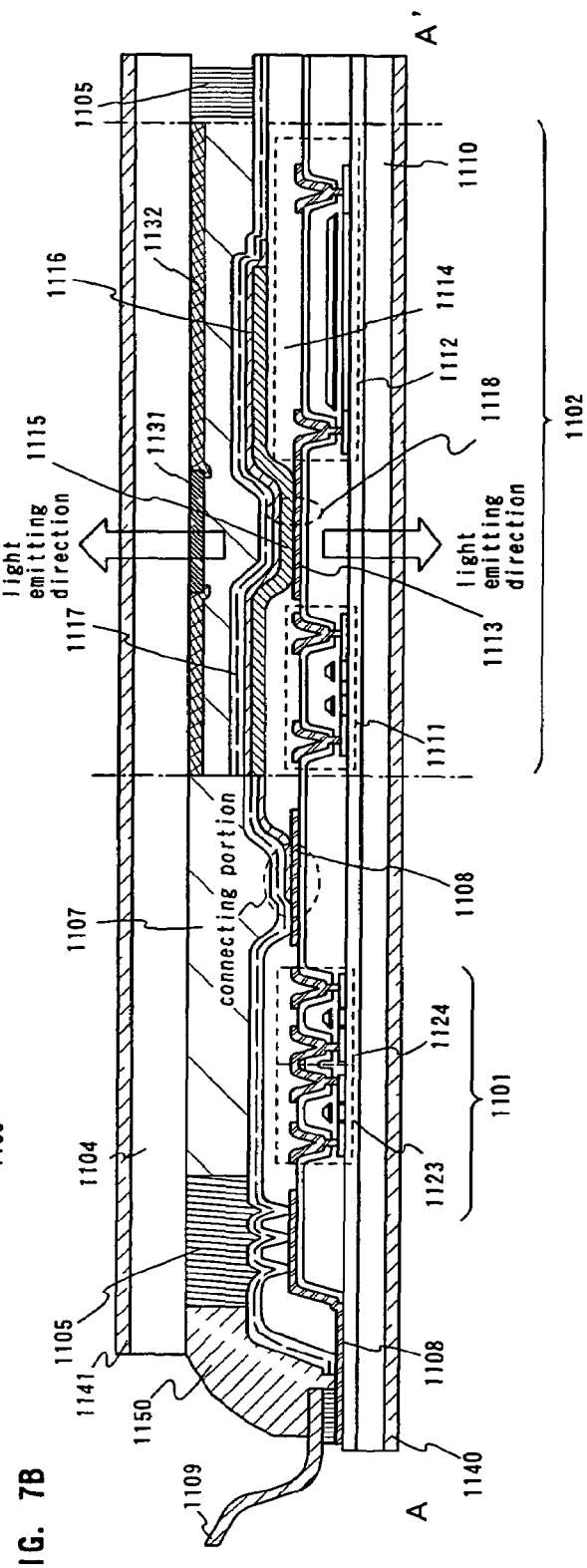
FIG. 7A
FIG. 7B

FIG. 9B folded state

FIG. 9C front side

FIG. 9D back side

FIG. 9G folded state

LIGHT EMITTING DEVICE

BACKGROUND OF THE INVENTION

1. Field of the Invention

The present invention relates to an organic light emitting element including an anode, a cathode, and a layer containing an organic compound (hereinafter, referred to as an electroluminescent layer) that generates light by applying an electric field through itself; and a light emitting device including the light emitting element. Specifically, the present invention relates to an organic light emitting element that exhibits white light emission and a full color light emitting device including the white light emitting element.

As used herein, the term "light emitting device" refers to an image display device or a light source (including a lighting system). Further, a module having a light emitting element attached with a connector such as an FPC (Flexible Printed Circuit), a TAB (Tape Automated Bonding), or a TCP (Tape Carrier Package); a module having a TAB or a TCP provided with a printed wiring board at the tip thereof; and a module having a light emitting element directly mounted with an IC (Integrated Circuit) by COG (Chip On Glass) are all included in the light emitting device.

2. Related Art

An electroluminescent element includes an electroluminescent layer interposed between a pair of electrodes (anode and cathode). The emission mechanism is as follows. Upon applying a voltage between the pair of electrodes, holes injected from the anode and electrons injected from the cathode are recombined with each other at luminescent centers within the electroluminescent layer to lead to formation of molecular excitons, and the molecular excitons return to the ground state while radiating energy to emit photon.

An electroluminescent layer in the electroluminescent element may be made of low molecular weight materials or high molecular weight materials by vapor deposition (including vacuum vapor deposition), spin application, ink jetting, dipping, electrolytic polymerization, or the like.

These methods are appropriately selected depending on properties of materials or a shape of a film. For example, electrolytic polymerization is used to pattern form a film made of high molecular weight materials. (For example, refer to Japanese Unexamined Patent Publication No. 9-97679.)

A light emitting element containing an organic compound has a defect to be easily deteriorated by various factors; therefore, it is the biggest issue to obtain high reliability (longer lifetime) of the light emitting element.

The light emitting element containing an organic compound is easily deteriorated, and a defective condition in which a partial decrease in luminance occurs or a non-light-emitting region is generated is observed. When a layer containing an organic compound is crystallized, characteristics (luminance-current characteristics, current efficiency-current characteristics, current-voltage characteristics, or the like) are deteriorated.

SUMMARY OF THE INVENTION

It is an objective of the present invention to reduce or eliminate generation of the above described various defective modes of the light emitting element containing an organic compound.

Inventors of the present invention assume that random arrangement of organic compound molecules in a layer containing an organic compound causes the light emitting element containing an organic compound to be easily deteriorated. According to the present invention, molecules in the layer containing an organic compound are arranged (or oriented) in a certain direction. Specifically, it is preferable to arrange molecules with a structure having a high planarity.

One structure of the present invention disclosed in this specification is a light emitting device including a plurality of light emitting elements including: a cathode; a layer containing an organic compound in contact with the cathode; and an anode in contact with the layer containing an organic compound, wherein molecules in the layer containing an organic compound are oriented in one direction.

Another structure of the present invention is a light emitting device comprising a plurality of light emitting elements comprising: a cathode; a layer containing an organic compound in contact with the cathode; and an anode in contact with the layer containing an organic compound, wherein molecular chains of molecules in the layer containing an organic compound is oriented in the same direction as current flowing from the cathode to the anode.

It is preferable to dispose materials for inhibiting crystallization among the arranged molecules in order to suppress crystallization of a material.

Another structure of the present invention disclosed in this specification is a light emitting device including a plurality of light emitting elements including: a cathode; a layer containing an organic compound in contact with the cathode; and an anode in contact with the layer containing an organic compound, wherein molecular chains of molecules in the layer containing an organic compound are continuously oriented in the same direction as current flowing from the cathode to the anode, and a material for inhibiting crystallization of the organic compound is disposed among the arranged molecules.

Solution including an organic compound molecule having a group easily reacted and combined with a first electrode material is applied onto the first electrode serving as an anode or a cathode in order to arrange organic compound molecules. For example, thiols (RSH) are reacted with an electrode containing Au, Pt, or Ag to form an Au—S bond, a Pt—S bond, or an Ag—S bond on the surface of the electrode.

A structure regarding a method for manufacturing of the present invention is a method for manufacturing a light emitting device including a plurality of light emitting elements comprising: a cathode; a layer containing an organic compound in contact with the cathode; and an anode in contact with the layer containing an organic compound, including the steps of: forming a cathode containing Au, Pt, or Ag; arranging a long axis of an organic compound molecule having a thiol group (SH group) perpendicular to an electrode surface by reacting the organic compound molecule with a surface of the cathode; and forming an anode.

Organic compound molecules may be arranged by evaporating at a slow evaporation rate, after performing surface modification by reacting a group including halogen, for example, an organic compound containing SiCl, COCl, or $SO_2Cl$ with an electrode made of ITO.

The organic compound molecules may be arranged by electrolytic polymerization after performing surface modification for arranging the molecules. The molecules are easily arranged in a direction of current by forming a layer containing an organic compound with current applied in one direction after performing surface modification on an electrode or forming an ultra thin film by application in advance. The molecules may be arranged by intermolecular electrostatic interaction.

Another structure regarding a method for manufacturing of the present invention is a method for manufacturing a light emitting device including a plurality of light emitting elements including: a cathode; a layer containing an organic compound in contact with the cathode; and an anode in contact with the layer containing an organic compound, includes the steps of: forming an anode containing metal oxide; forming a thin film by arranging molecules on an surface of the anode by application; forming a layer containing an organic compound by regularly arranging organic compound molecules along a molecular arrangement in the thin film by vapor deposition; and forming a cathode.

After forming a first layer containing an organic compound, regular depressions and projections may be formed by a rubbing treatment. Organic compound molecules may be arranged along the depressions and the projections by forming a second layer containing an organic compound thereover. Liquid crystal molecules having a light emitting substance at the end thereof as the organic compound molecules may be arranged along the depressions and the projections formed by rubbing. In this case, molecular chains are arranged parallel to an electrode plane, thereby forming a p orbit of an aromatic ring in a direction perpendicular to the electrode plane. Accordingly, the organic compound molecules can be arranged so that hopping conduction of carriers occurs in a direction perpendicular to the electrode with electrons moved between the electrodes.

Another structure of the present invention disclosed in this specification is a light emitting device includes a plurality of light emitting elements including: a cathode; a layer containing an organic compound in contact with the cathode; and an anode in contact with the layer containing an organic compound, wherein the anode has regular depressions and projections on its surface, and molecules of the layer containing an organic compound are oriented along the regular depressions and projections.

Another structure of the present invention is a light emitting device including a plurality of light emitting elements including: a cathode; a layer containing an organic compound in contact with the cathode; and an anode in contact with the layer containing an organic compound, wherein the layer containing an organic compound has a laminate structure, a first layer containing an organic compound has regular depressions and projections on its surface, and molecules of a second layer containing an organic compound are arranged along the regular depressions and projections.

A method for manufacturing for obtaining the above described structure is a method for manufacturing a light emitting device comprising a plurality of light emitting elements including: a cathode; a layer containing an organic compound in contact with the cathode; and an anode in contact with the layer containing an organic compound, includes the steps of: forming an anode; forming a partition containing an insulating material and covering an edge portion of the anode; forming a first layer containing an organic compound over the anode; forming regular depressions and projections by performing a rubbing treatment on a surface of the first layer containing an organic compound; forming a second layer containing an organic compound oriented along the depressions and the projections; and forming a cathode.

In each of the above described structures, the light emitting element emits light of any one of red, green, and blue in the case of displaying in full color. In addition, in each of the above described structures, all of the plurality of light emitting elements emit light of red, green, blue, or white in the case of displaying in monochrome.

Note that a light emitting element (EL element) includes a layer containing an organic compound (hereinafter, referred to as an EL layer) which generates luminescence (electro luminescence) by applying an electric field, an anode, and a cathode. Luminescence obtained from organic compounds is divided into luminescence (fluorescence) generated at the time of returning from a singlet excited state to a ground state or luminescence (phosphorescence) at the time of returning from a triplet excited state to a ground state. Both types of the luminescence can be employed in a light emitting device manufactured in accordance with the present invention.

A light emitting element (EL element) including an EL layer has a structure in which the EL layer is interposed between a pair of electrodes. Typically, an EL layer has a laminate structure: a hole transporting layer; a light emitting layer; an electron transport layer. The structure provides extremely high light emission efficiency, and is adopted in most of light emitting devices that are currently under development.

Further, a structure in which a hole injection layer, a hole transport layer, a light emitting layer, and an electron transport layer are laminated in this order over an anode or a structure in which a hole injection layer, a hole transport layer, a light emitting layer, an electron transport layer, an electron injection layer are laminated in this order over an anode may be employed. A fluorescent pigment or the like may be doped into the light emitting layer. All of the layers may be made of low molecular weight materials or made of high molecular weight materials. A layer including an inorganic material may also be used. In addition, the term "EL layer" in this specification is a generic term used to refer to all layers interposed between the anode and the cathode. Therefore, the EL layer includes all of the above described hole injection layer, the hole transport layer, the light emitting layer, the electron transport layer, and the electron injection layer.

In a light emitting device according to the present invention, a driving method of a screen display is not particularly limited. For example, a dot-sequential driving method, a linear-sequential driving method, a plane-sequential driving method, or the like can be employed. Typically, a linear-sequential driving method is employed, and a time ratio gray scale driving method or an area ratio gray scale driving method is appropriately employed. Video signals inputted to a source line of the light emitting device may be analog signals or digital signals, and driver circuits and the like are designed in accordance with the type of the video signals as appropriate.

The present invention can be applied not only to an active matrix light emitting device but also to a passive matrix light emitting device.

These and other objects, features and advantages of the present invention will become more apparent upon reading of the following detailed description along with the accompanied drawings.

BRIEF DESCRIPTION OF THE DRAWINGS

In the accompanying drawings.

FIGS. 7A and 7B show a structure of an active matrix EL display device (Embodiment 1);

FIGS. 9A to 9G show examples of electronic appliances.

DETAILED DESCRIPTION OF THE INVENTION

Embodiment modes of the present invention are described hereinafter.

Embodiment Mode 1

Figure 1:
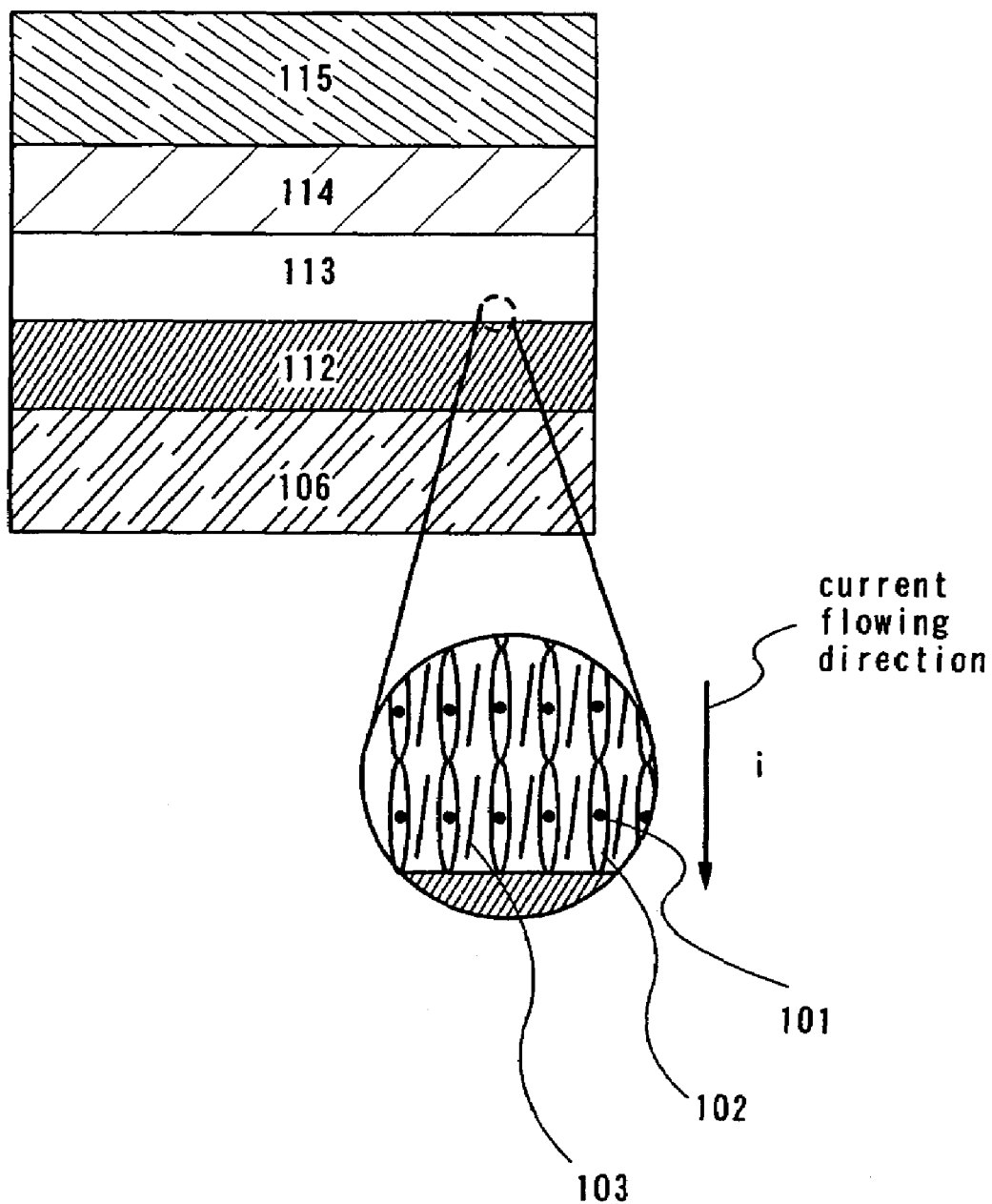
FIG. 1 shows Embodiment Mode 1.

FIG. 1 shows a schematic diagram of the present invention.

According to the invention, an electroluminescent layer is formed over an electrode (first electrode) 106 that is formed over a substrate (not shown) as shown in FIG. 1. As a material for the substrate, glass, quartz, transparent plastics, or the like can be used.

In addition, the first electrode 106 may function as either an anode or a cathode. A plurality of the first electrodes 106 may be pattern formed over the substrate. In the case of an active matrix light emitting device, a plurality of TFTs are formed over the substrate. The first electrodes 106 are electrically connected to source electrodes or drain electrodes of the TFTs and are arranged in a matrix configuration.

In addition, in the case where the first electrode 106 functions as an anode, metals, alloys, electrically conductive compounds, and mixtures of these materials, which have large work functions (at least 4.0 eV), can preferably be used as anode materials. As a specific example of the anode materials, ITO (indium tin oxide), IZO (indium zinc oxide) composed of indium oxide mixed with zinc oxide (ZnO) of from 2% to 20%, aurum (Au), platinum (Pt), nickel (Ni), tungsten (W), chrome (Cr), molybdenum (Mo), ferrum (Fe), cobalt (Co), copper (Cu), palladium (Pd), nitride of metal materials (for example, TiN), or the like can be used.

In the case where the first electrode 106 functions as a cathode, metals, alloys, electrically conductive compounds, and mixtures of these materials, which have small work functions (at most 3.8 eV), can preferably be used as cathode materials. As a specific example of the cathode materials, transition metals containing a rare earth metal can be used, besides elements in the first or second periodic row, that is, alkaline metals such as Li, Cs, and the like, alkaline earth metals such as Mg, Ca, Sr, and the like, alloys of these elements (MgAg, AlLi), or compounds (LiF, CsF, $CaF_2$). Alternatively, the first electrode 106 can be made of transition metals containing a rare earth metal and a laminated layer of the transition metals and metals such as Al, Ag, and ITO (including alloys).

The above described anode and cathode materials are deposited by vapor deposition or sputtering to form a thin film. The thin film is preferably formed to have a thickness of from 10 nm to 500 nm.

In an electroluminescent element according to the invention, in the case where the first electrode 106 serves as an anode, a second electrode that is formed in later process serves as a cathode.

An electroluminescent element according to the present invention has a structure that light generated by recombination of carries within the electroluminescent layer is emitted from either the first electrode 106 or the second electrode 115, or both of the electrodes. When light is emitted from the first electrode 106, the first electrode 106 is made of a transparent/translucent material. When light is emitted from the second electrode 115, the second electrode is made of a transparent/translucent material. The case where the first electrode 106 serves as an anode made of transparent/translucent materials and the second electrode serves as a cathode made of materials having light shielding properties is described in this embodiment mode.

A first electroluminescent layer 112 is formed over the first electrode 106, a second electroluminescent layer 113 is formed over the first electroluminescent layer 112, and a third electroluminescent layer 114 is formed over the second electroluminescent layer 113. In the case of forming a laminate structure, a hole transport layer, a hole blocking layer, an electron transport layer, or the like as well as a light emitting layer can be used in combination to form the laminate structure by vapor deposition, coating, ink jetting, or the like.

The first electroluminescent layer 112 functions as a hole injection layer or a hole transport layer. As a hole injection material, porphyrin compounds are useful, specifically, phthalocyanine (abbreviated to $H_2$-Pc), copper phthalocyanine (abbreviated to Cu-Pc), or the like are applicable. Further, chemically doped high molecular weight conductive compounds can be used, such as polyethylene dioxythiophene (abbreviated to PEDOT) doped with polystyrene sulfonate (abbreviated to PSS), polyaniline (abbreviated to PAni), polyvinyl carbazole (abbreviated to PVK), or the like. A thin film of an inorganic semiconductor such as vanadium pentoxide or an ultra thin film of an inorganic insulator such as aluminum oxide can also be used. As hole transport materials, aromatic amine (that is, the one having a benzene ring-nitrogen bond) compounds are preferably used. For example, N,N'-bis(3-methylphenyl)-N,N'-diphenyl-1,1'-biphenyl-4,4'-diamine (abbreviated to TPD) or a derivative thereof such as 4,4'-bis[N-(1-naphthyl)-N-phenyl-amino]-biphenyl (abbreviated to α-NPD) is widely used. Also used are star burst aromatic amine compounds, including: 4,4', 4"-tris (N,N-diphenyl-amino)-triphenyl amine (abbreviated to TDATA); 4,4',4"-tris[N-(3-methylphenyl)-N-phenyl-amino]-triphenyl amine (abbreviated to MTDATA); and the like.

The second electroluminescent layer 113 is a light emitting layer. Note that molecules in at least one layer are arranged in one direction in the present invention. Here, in the light emitting layer, a plane of a metal complex molecule 102 is arranged so as to be perpendicular to the first electrode by using a metal complex having a central metal 101 and a planar structure, typically a platinum complex molecule 102 using platinum as a central metal. Current efficiency-luminance characteristics can be improved by adjusting the plane of the metal complex molecule 102 in a flowing direction of current.

Specifically, substances represented by following Structural Formulas 1 to 4 may be dispersed in a host material in high concentration, and may appropriately be oriented. A method for orienting the substances is not particularly limited. The light emitting layer is not limited to these metal complexes in the present invention.

[Structural Formula 1]

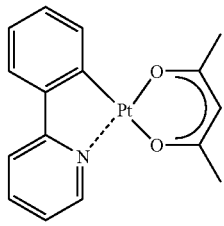

(1)

[Structural Formula 2]

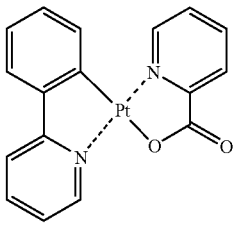

(2)

[Structural Formula 3]

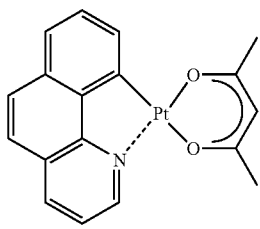

(3)

[Structural Formula 4]

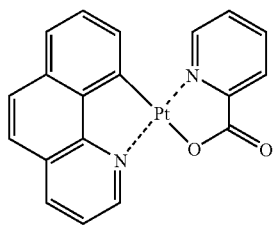

(4)

Further, a crystallization inhibitor 103 for inhibiting crystallization is preferably disposed among the disposed metal complex molecules to suppress crystallization and to improve reliability.

The third electroluminescent layer 114 functions as an electron injection layer or an electron transport layer. As electron transport materials, in specific, metal complexes such as tris(8-quinolinolate) aluminum (abbreviated to Alq$_3$), tris(4-methyl-8-quinolinolate) aluminum (abbreviated to Almq$_3$), bis(10-hydroxybenzo[h]-quinolinato) beryllium (abbreviated to BeBq$_2$), bis(2-methyl-8-quinolinolate)-(4-hydroxy-biphenylyl)-aluminum (abbreviated to BAlq), bis [2-(2-hydroxyphenyl)-benzooxazolate]zinc (abbreviated to Zn(BOX)$_2$), and bis [2-(2-hydroxyphenyl)-benzothiazolatel]zinc (abbreviated to Zn(BTZ)$_2$). Besides, oxadiazole derivatives, such as 2-(4-biphenyl)-5-(4-tert-butylphenyl)-1, 3,4-oxadiazole (abbreviated to PBD), and 1,3-bis[5-(p-tert-butylphenyl)-1,3,4-oxadiazole-2-yl]benzene (abbreviated to OXD-7); triazole derivatives such as 3-(4-tert-butylphenyl)-4-phenyl-5-(4-biphenylyl)-1,2,4-triazole (abbreviated to TAZ) and 3-(4-tert-butylphenyl)-4-(4-ethylphenyl)-5-(4-biphenylyl)-1,2,4-triazole (abbreviated to p-EtTAZ); imidazol derivatives such as 2,2',2"-(1,3,5-benzenetryil)tris[1-phenyl-1H-benzimidazole] (abbreviated to TPBI); and phenanthroline derivatives such as bathophenanthroline (abbreviated to BPhen) and. bathocuproin (abbreviated to BCP) can be used in addition to metal complexes.

As electron injection materials, the above described electron transport materials can be used. Besides, an ultra thin film of an insulator, for example, an alkaline metal halogenated compound such as LiF, CsF, or the like; an alkaline earth halogenated compound such as CaF$_2$ or the like; or an alkaline metal oxide such as Li$_2$O is often used. In addition, an alkaline metal complex such as lithium acetylacetonate (abbreviated to Li(acac)), 8-quinolinolato-lithium (abbreviated to Liq), or the like can also be used.

When the light emitting element shown in FIG. 1 emits light by applying current thereto, current efficiency-luminance characteristics can be improved by orienting organic compound molecules in a flowing direction of current. Further, deterioration can be prevented by using the crystallization inhibitor.

Embodiment Mode 2

An example of forming a layer containing an organic compound by electrolytic polymerization is described as an example of a method for orienting organic compound molecules. After performing surface modification on an electrode or forming an ultra thin film (not shown) in advance by application, a layer containing an organic compound is formed by electrolytic polymerization.

Figure 2A:
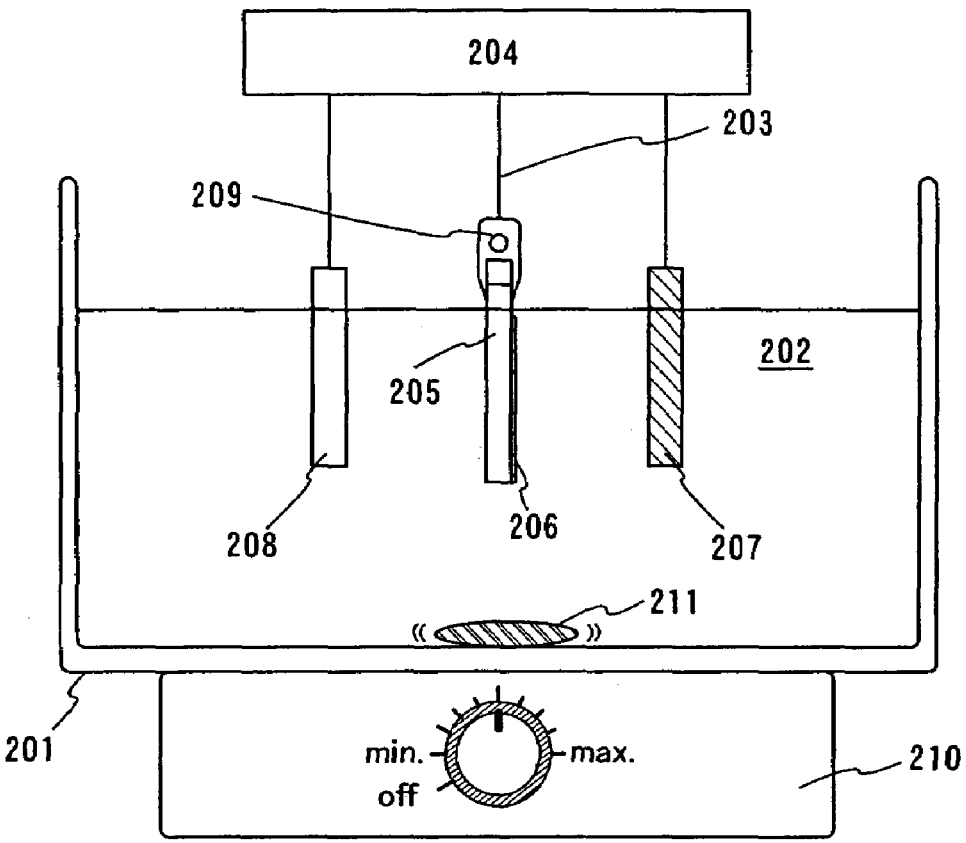
FIGS. 2A and 2B show Embodiment Mode 2.
Figure 2B:
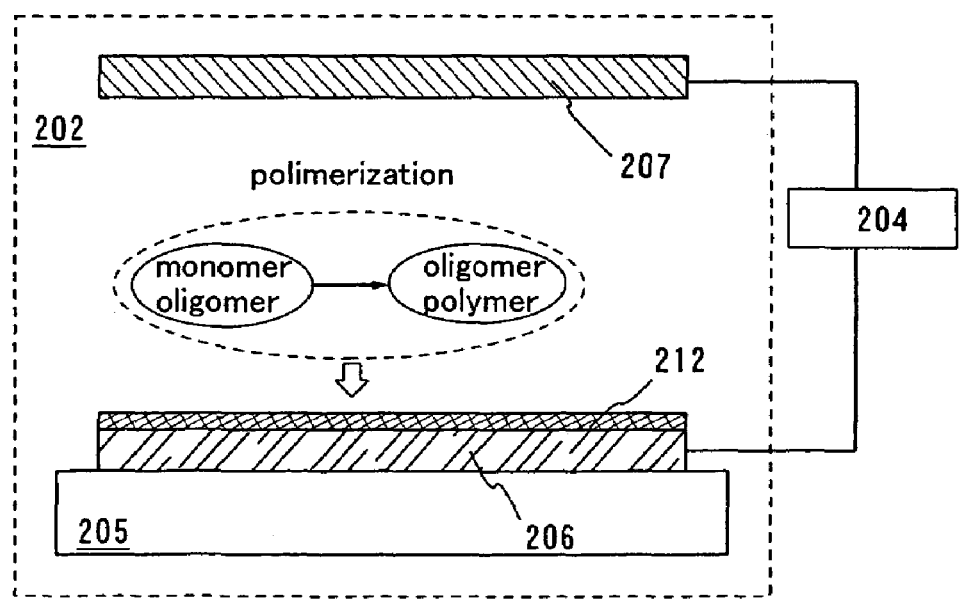

As shown in FIG. 2A, a reaction tank 201 holds an electrolytic solution 202, and a substrate 205 on which a first electrode 206 electrically connected to a power source 204 via a wiring 203 is formed, a counter electrode 207, and a reference electrode 208 are immersed in the electrolytic solution 202. In addition, the substrate 205 is secured by a support medium 209 that electrically connects the first electrode (anode or cathode, here, an anode) 206 to the wiring 203.

The power source 204 includes a potentiostat which is capable of applying a constant electric potential and a coulombmeter which measures an amount of a flowing electric charge. The counter electrode 207 is made of platinum. Further, the reference electrode 208 is made of Ag/AgCl.

The reaction tank 201 is provided over a magnetic stirrer 210. In the reaction tank 210, a rotator 211 in the electrolytic solution 202 is controlled by the magnetic stirrer 210 to continuously stir the electrolytic solution 202.

When a predetermined current is applied to the counter electrode 207, and the first electrode (here, an anode) 206 on the substrate 205 via the support medium 209, respectively, a monomer or an oligomer in the electrolytic solution 202 is polymerized on the surface of the first electrode 206 by electrolytic polymerization to form a first electroluminescent layer (electrolytic polymerization film) 212 containing a polymer as its main component. According to the invention, an electrolytic polymerization film with surface roughness of at most 6.0 nm, preferably, from 4.0 nm to 5.0 nm can be formed by setting the condition, that is, the first electrode 206 has the size of 0.04 cm², the current is applied from the power source 204 at from 0.016 mA to 0.06 mA, and the current is applied for from 0.8 sec to 3.0 sec. Consequently, decline in luminous efficiency or deterioration of an electroluminescent element due to electric voltage concentration that becomes a problem caused by poor planarity of a film surface can be prevented, and device characteristics and lifetime can be improved.

In the present invention, as a supporting electrolyte contained in the electrolytic solution 202, salts such as natrium perchlorate, lithium perchlorate, tetrabutylammonium perchlorate (hereinafter, TBAP), or tetrabutylammonium tetrafluoroborate; other bases; or other acids can be used. The solvent for the electrolytic solution 202 can be one of water, acetonitrile, benzonitrile, N,N-dimethylformamide, dichloromethane, tetrahydrofuran, propione carbonate; or a mixture of these solvents can be used.

As a monomer or an oligomer contained in the electrolytic solution 202, aniline, phenylene oxide, or the like can be used in addition to thiophene based materials (specifically, thiophene, 3,4-ethylenedioxythiophene, or the like), pyrrol based materials (specifically, pyrrol, indol, or the like), or aromatic hydrocarbon based materials (specifically, benzene, naphthalene, azulene, or the like).

Subsequently, an electroluminescent layer (a combined layer of a light emitting layer, a hole transport layer, a hole blocking layer, an electron transport layer, or the like) is appropriately laminated over the electrolytic polymerization film 212, and lastly, a second electrode 215 serving as a cathode is formed thereover. As cathode materials for the second electrode 215, materials described above in Embodiment Mode 1 may be used.

Accordingly, an electroluminescent element including an electroluminescent layer formed between a pair of electrodes by electrolytic polymerization can be manufactured. Since a layer containing an organic compound is formed with current applied after performing surface modification on an electrode or forming an ultra thin film (not shown) in advance by application, molecules are easily oriented.

This embodiment mode can freely be combined with Embodiment mode 1.

Embodiment Mode 3

Another example of a method for orienting organic compound molecules is described here.

Figure 3:
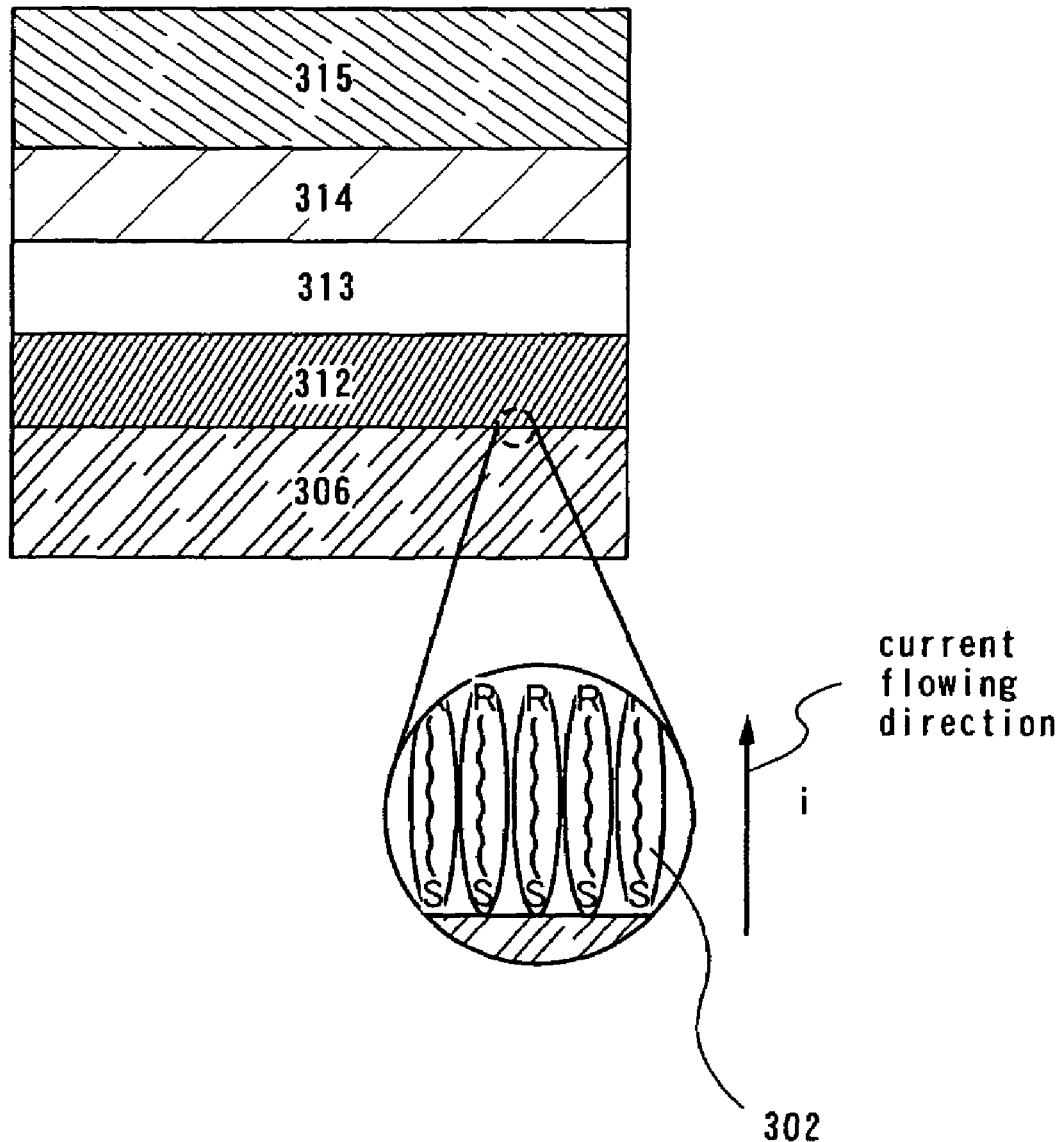
FIG. 3 shows Embodiment Mode 3.

FIG. 3 shows a light emitting element in which layers containing an organic compound is used as electroluminescent layers 312 to 314, a first electrode 306 is used as a cathode, and a second electrode 315 is used as an anode. An organic compound molecule 302 shown in Structural Formula 5 is reacted with a surface of the first electrode containing Au, Pt, or Ag to form an Au—S bond, a Pt—S bond, or an Ag—S bond.

[Structural Formula 5]

$$HS—(CH_2)_n—X—Ar \quad (5)$$

Note that n=2 to 6, or 8. Structural Formula 6 shows an example of X in Structural Formula 5, and Structural Formula 7 shows an example of Ar. Ar here is a general abbreviation for an aryl (aromatic) group.

[Structural Formula 6]

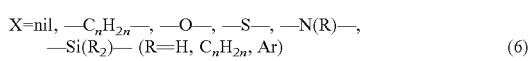

[Structural Formula 7]

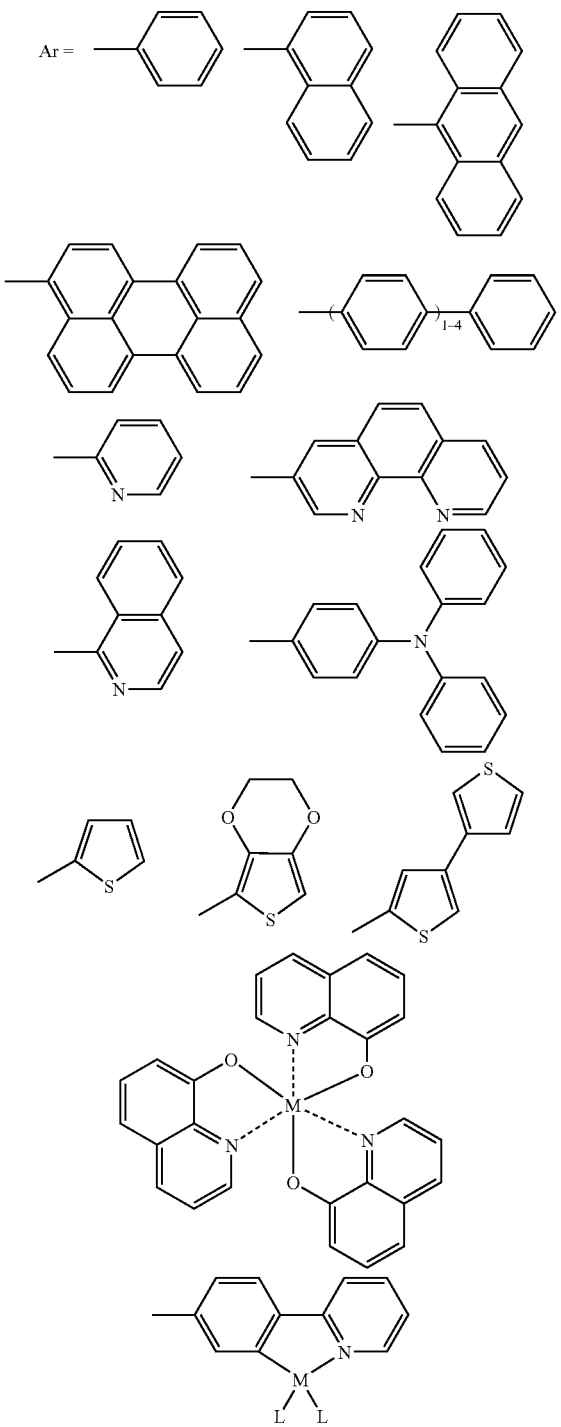

Combination of X and Ar may be arbitrary. In addition, Structural Formula 5 may not include X.

Solution including these materials is applied or these materials are evaporated to form the first electroluminescent layer 312. The Au—S bond, the Pt—S bond, or the Ag—S bond is formed on a surface of the first electrode 306, and the organic compound molecules 302 are arranged in a flowing direction of current as shown in FIG. 3. The first electroluminescent layer 312 functions as an electron injection layer or an electron transport layer.

A second electroluminescent layer 313 functioning as a light emitting layer is formed over the first electroluminescent layer 312, and a third electroluminescent layer 314 functioning as a hole injection layer is formed over the second electroluminescent layer 313. In the case of forming a laminate structure, a hole transport layer, a hole blocking layer, an electron transport layer, or the like as well as a light emitting layer can be used in combination to form the laminate structure by vapor deposition, application, ink-jetting, or the like.

Lastly, the second electrode 315 serving as an anode is formed. As anode materials for the second electrode 315, materials described above in Embodiment Mode 1 may be used.

Accordingly, an electroluminescence element including the first electroluminescent layer 312 between a pair of electrodes can be formed. In the first electroluminescent layer 312, the organic compound molecules 302 are oriented in one direction. Current efficiency-luminance characteristics can be improved by orienting organic compound molecules in a flowing direction of current as shown in FIG. 3.

This embodiment mode can freely be combined with Embodiment Mode 1 or 2.

Embodiment Mode 4

Another example of a method for orienting organic compound molecules is described here.

Hereinafter, procedures of manufacturing a light emitting element in which a layer containing an organic compound is used as an electroluminescent layer, a first electrode containing metal oxide, typically ITO is used as an anode, and a second electrode is used as a cathode are described.

At first, a first electrode containing metal oxide, typically ITO is formed. As anode materials for the first electrode, materials described above in Embodiment Mode 1 may be used.

Figure 4A:
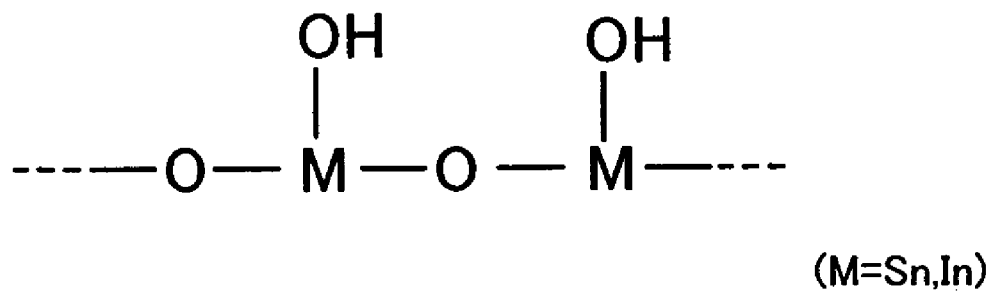
FIGS. 4A and 4B show Embodiment Mode 4.

FIG. 4A shows a model diagram of a molecular bond at a top surface of metal oxide, and shows a state in which the top surface of the metal oxide includes an OH group.

Figure 4B:
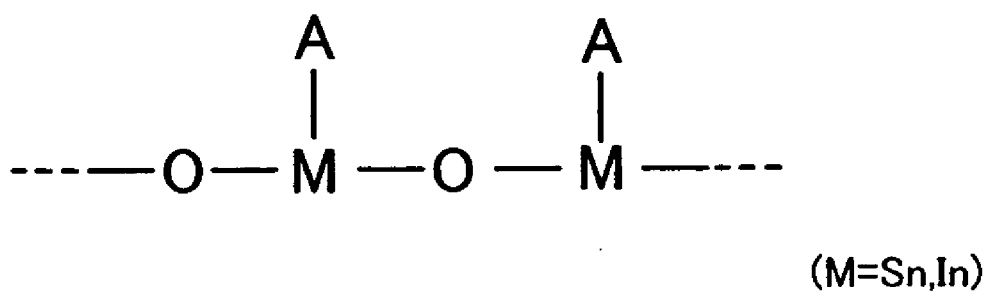
Figure 4B:
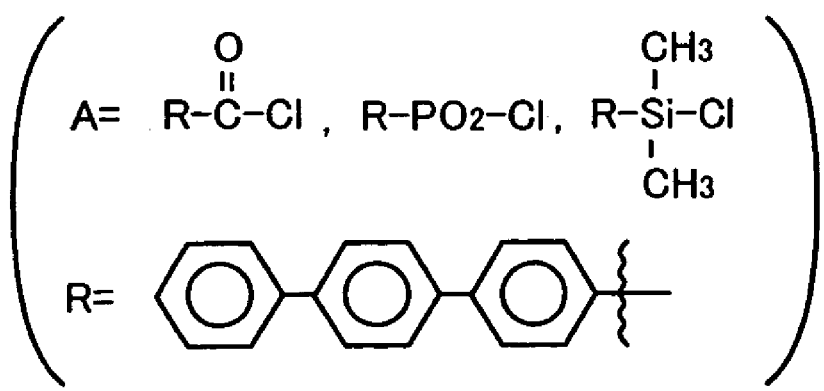

Subsequently, solution including a molecule represented by a structural formula R—Cl in FIG. 4B is applied onto the surface of the metal oxide by application, and surface modification is performed by reacting the molecule. A model diagram of a molecular bond on a top surface of the metal oxide after the surface modification is shown in FIG. 4B. R within the molecule is regularly introduced onto a metal element M by the surface modification.

A layer containing an organic compound is laminated by evaporating at a comparatively slowed evaporation rate after the surface modification. Vapor deposition is performed along a functional group R regularly combined with the metal element M. In the case of forming a laminate structure, a hole transport layer, a hole blocking layer, an electron transport layer, or the like as well as a light emitting layer can be used in combination to form the laminate structure by vapor deposition, application, ink-jetting, or the like.

Lastly, a second electrode serving as a cathode is formed. As cathode materials for the second electrode, materials described above in Embodiment Mode 1 may be used.

Accordingly, an electroluminescence element including an electroluminescent layer between a pair of electrodes can be formed. In the electroluminescent layer, organic compound molecules are oriented in one direction.

This embodiment mode can freely be combined with any one of Embodiment Modes 1 to 3.

Embodiment Mode 5

Figure 5A:
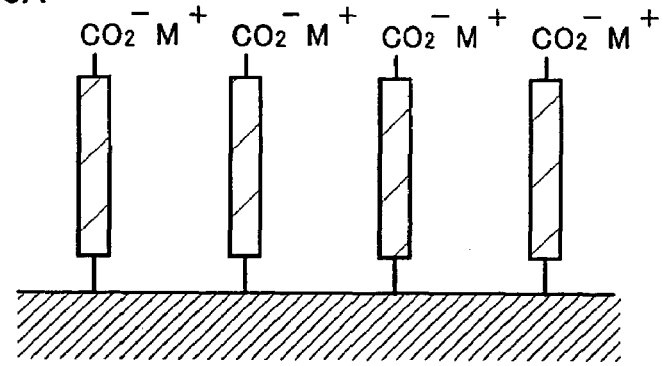
FIGS. 5A to 5C show Embodiment Mode 5.

Here, an example of a method for orienting molecules by intermolecular electrostatic interaction is described with reference to FIGS. 5A to 5C.

At first, an electrode serving as a cathode (or an anode) is formed. Subsequently, an organic compound molecule (organic compound molecule having a comparatively long molecular chain) is introduced into an electrode surface as shown in FIG. 5A. For example, the method described in Embodiment Mode 4 may be employed as an introducing method. Note that M denotes an arbitrary metal element.

Figure 5B:
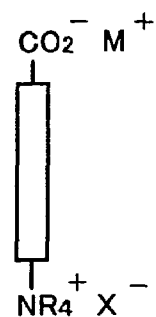
Figure 5C:
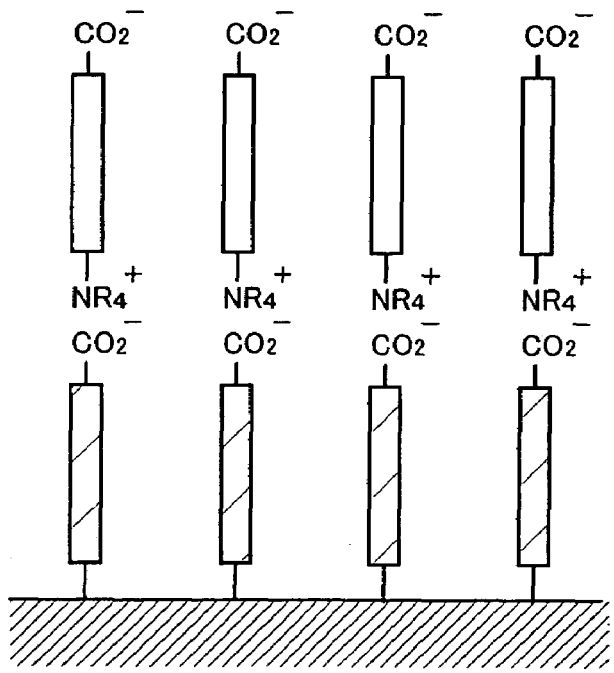

Subsequently, a compound shown in FIG. 5B is applied or evaporated to regularly arrange molecules as shown in FIG. 5C. As shown in FIG. 5C, orientation of molecules is determined by electrostatic interaction, and molecules are arranged regularly.

In the case of forming a laminate structure, a light emitting layer, a hole injection layer, a hole transport layer, a hole blocking layer, an electron transport layer, an electron injection layer, or the like can be used in combination to form the laminate structure by vapor deposition, application, ink-jetting, or the like.

Lastly, an electrode serving as an anode (or a cathode) is formed.

Accordingly, an electroluminescent element including an electroluminescent layer between a pair of electrodes can be formed. In the electroluminescnet layer, organic compound molecules are oriented in one direction.

This embodiment mode can freely be combined with any one of Embodiment Modes 1 to 4.

Embodiment Mode 6

Figure 6A:
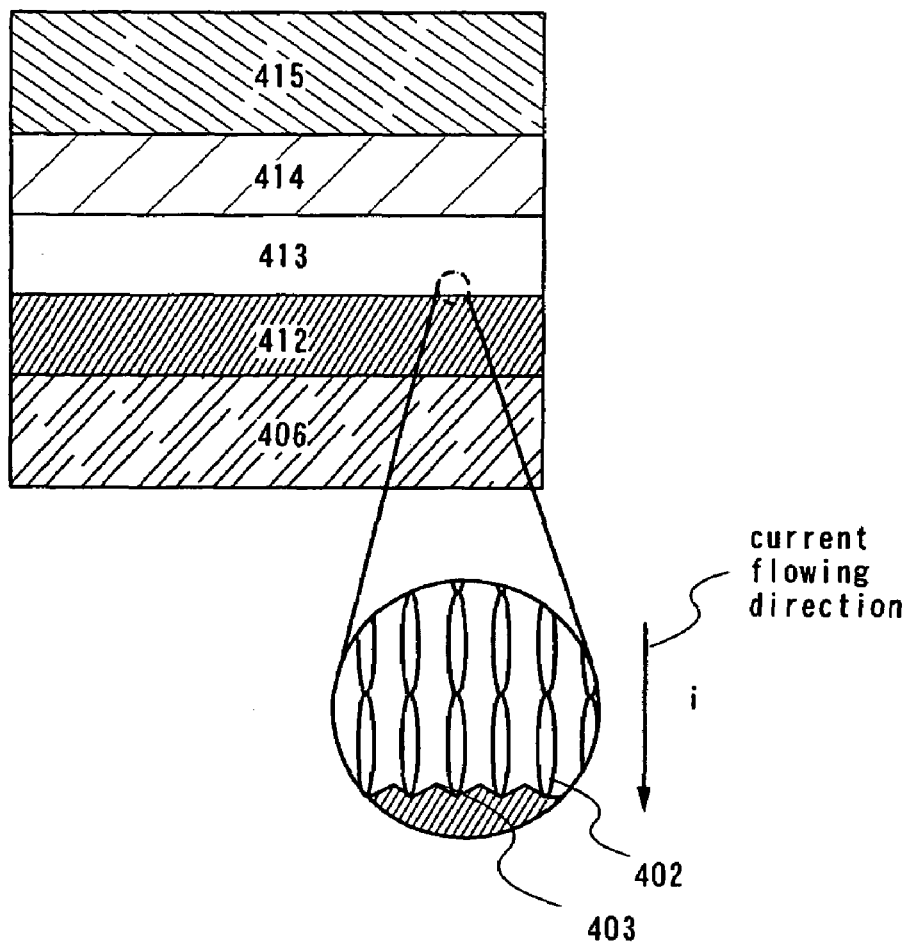
FIGS. 6A and 6B show Embodiment Mode 6.

Here, an example of forming regular depressions and projections by means of physical force and orienting organic compound molecules in a certain direction along the regular depressions and the projections is described with reference to FIGS. 6A and 6B.

At first, first electrodes 406 are disposed in a matrix configuration over a substrate 400, and partitions 401 containing an insulating material and covering edge portions of the first electrodes 406 are formed. Subsequently, a first electroluminescent layer 412 is formed. Here, poly (ethylenedioxy thiophene)/poly (styrenesulfonate) solution (PEDOT/PSS) is applied by spin coating to form a layer functioning as a hole injection layer as the first electroluminescent layer 412. As another hole injection material, polyaniline/camphor sulfonate solution (PANI/CSA), PTPDES, Et-PTPDEK, PPBA, or the like can be used.

Figure 6B:
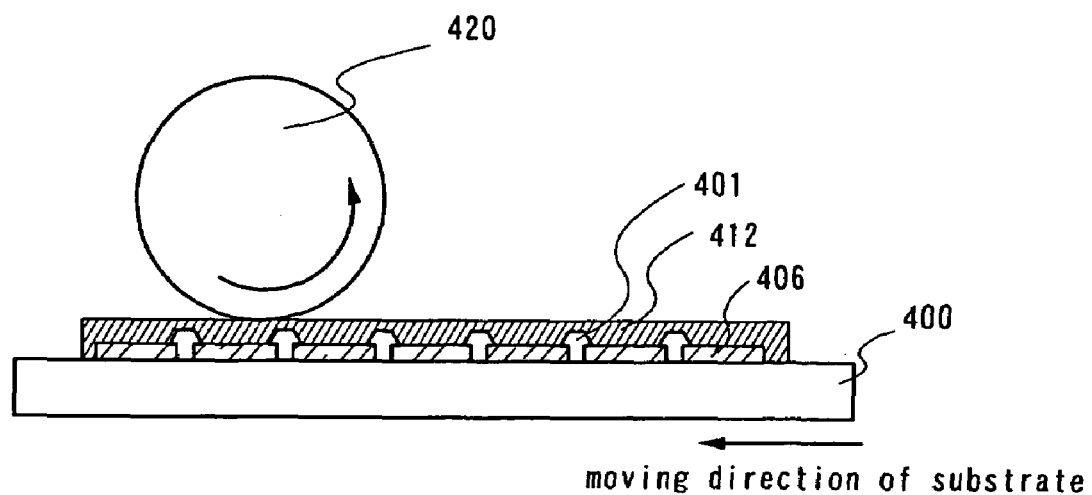

Subsequently, a surface of the electroluminescent layer formed over the electrode (the first electrode) disposed over the substrate 400 is rubbed with a roller 420 which is wound with a rubbing fabric (not shown) as shown in FIG. 6B. The roller 420 rotates, and the surface is rubbed in one direction by moving the substrate 400. Regular depressions and projections 403 are formed on the surface of the first electroluminescent layer 412 as shown in FIG. 6A by rubbing with the roller 420.

Subsequently, a second electroluminescent layer 413 (a layer serving as a light emitting layer) is formed by using a material including a molecule 402 having a comparatively long molecular chain, for example a liquid crystal molecule having a light emitting substance at the end thereof. The molecules 402 having a long molecular chain are oriented along the regular depressions and projections 403 formed by rubbing. In this case, although a molecular chain is arranged parallel to a plane of the electrode 406, liquid crystal molecules are preferably stacked in a condition that p orbits are formed perpendicular to the plane of the electrode so that electrons move between electrodes due to perpendicular hopping coduction. A direction perpendicular to the plane of the electrode is the same direction as a direction of current flowing through the light emitting element.

Subsequently, a third electroluminescent layer 414 functioning as an electron injection layer is formed over the second electroluminescent layer 413. In the case of forming a laminate structure, a hole transport layer, a hole blocking layer, an electron transport layer, or the like as well as a light emitting layer can be used in combination to form the laminate structure by vapor deposition, application, ink-jetting, or the like.

Lastly, a second electrode 415 serving as a cathode or an anode is formed. As cathode materials for the second electrode 415, materials described above in Embodiment Mode 1 may be used.

Accordingly, an electroluminescent element including the second electroluminescent layer 413 between a pair of electrodes can be formed. In the second electroluminescent layer 413, the molecules 402 having long chains are oriented in one direction. Current efficiency-luminance characteristics can be improved by orienting organic compound molecules in a flowing direction of current as shown in FIGS. 6A and 6B.

Here, an example of orienting molecules of the second electroluminescent layer 413 by performing a rubbing treatment on the first electroluminescent layer 412 is described; however, the present invention is not particularly limited thereto. Molecules of the third electroluminescent layer 414 may be oriented by performing a rubbing treatment on the second electroluminescent layer 413. In addition, molecules of the first electroluminescent 412 may be oriented by performing a rubbing treatment on the first electrode 406.

This embodiment mode can freely be combined with any one of Embodiment Modes 1 to 5.

The present invention including the above described structures is described in further detail in following embodiments.

EMBODIMENT

Embodiment 1

In this embodiment, a method for manufacturing a light emitting device (dual emission structure) having a light emitting element using an organic compound layer as a light emitting layer, over a substrate having an insulating surface is described with reference to FIGS. 7A and 7B.

FIG. 7A is a top view of a light emitting device. FIG. 7B is a cross-sectional view of FIG. 7A taken along a line A-a'. Reference numeral 1101 indicated by a dotted line denotes a source signal line driver circuit; 1102, a pixel portion; 1103, a gate signal line driver circuit; 1104, a transparent sealing substrate; 1105, a first sealing agent; and 1107, a second sealing agent. The inside surrounded by the first sealing agent 1105 is filled with the transparent second sealing agent 1107. In addition, the first sealing agent 1105 contains a gap agent for spacing substrates.

Reference numeral 1108 denotes a wiring for transmitting signals inputted to the source signal line driver circuit 1101 and the gate signal line driver circuit 1103. The wiring receives video signals or clock signals from an FPC (flexible printed circuit) 1109 serving as an external input terminal. Although only FPC is illustrated in the drawing, a PWB (printed wiring board) may be attached to the FPC. In addition, resin 1150 is provided to cover the FPC1109.

Then, a cross-sectional structure is described with reference to FIG. 7B. A driver circuit and a pixel portion are formed over a transparent substrate 1110. In FIG. 7B, the source signal driver circuit 1101 and the pixel portion 1102 are illustrated as driver circuits.

The source signal driver circuit 1101 is provided with a CMOS circuit formed by combining an n-channel TFT 1123 and a p-channel TFT 1124. A TFT for forming a driver circuit may be formed with a known CMOS, PMOS, or NMOS circuit. In this embodiment, a driver integrated type in which a driver circuit is formed over the substrate is described, but not exclusively, the driver circuit can be formed outside instead of over the substrate. In addition, the structure of a TFT using a polysilicon film or an amorphous silicon film as an active layer is not especially limited. A top gate TFT or a bottom gate TFT can be adopted.

The pixel portion 1102 includes a plurality of pixels including a switching TFT 1111, a current control TFT 1112, and a first electrode (anode) 1113 electrically connected to a drain of the current control TFT 1112. The current control TFT 1112 may be either an n-channel TFT or a p-channel TFT. In the case where the current control TFT 1112 is connected to an anode, the TFT is preferably a p-channel TFT. A holding capacitor (not shown) may appropriately be provided. In FIG. 7B, a cross-sectional structure of only one of thousands of pixels is illustrated to show an example that two TFTs are used for the pixel. However, three or more numbers of pixels can be appropriately used.

Since the first electrode 1113 is directly in contact with the drain of a TFT a bottom layer of the first electrode 1113 is preferably made of a material capable of making an ohmic contact with the drain containing silicon, and a top layer, which is in contact with a layer containing an organic compound, is preferably made of a material having a large work function. For example, a transparent conductive film (ITO (indium tin oxide), an indium oxide-zinc oxide alloy ($In_2O_3$—ZnO), zinc oxide (ZnO), or the like), is used.

An insulator (also referred to as a bank, a partition, a mound, or the like) 1114 is formed at the both edges of the first electrode (anode) 1113. The insulator 1114 may be made of an organic resin film or an insulating film containing silicon. In this example, an insulator is made of a positive photosensitive acrylic resin film as the insulator 1114 in the shape as illustrated in FIG. 7B.

In order to make coverage favorable, an upper edge portion or a lower edge portion of the insulator 1114 is formed to have a curved face having a radius of curvature. For example, when a positive photosensitive acrylic resin is used as a material for the insulator 1114, only upper edge portion of the insulator 1114 preferably has a radius of curvature (from 0.2 µm to 3 µm). As the insulator 1114, either a negative photosensitive resin that becomes insoluble to etchant by light or a positive photosensitive resin that becomes dissoluble to etchant by light can be used.

Further, the insulator 1114 may be covered with a protective film containing an aluminum nitride film, an aluminum nitride oxide film, a thin film containing carbon as its main component, or a silicon nitride film.

A layer containing an organic compound 1115 is selectively formed over the first electrode (anode) 1113 by vapor deposition. In this embodiment, the layer containing an organic compound 1115 is formed with a manufacturing device described in Embodiment Mode 2 to obtain uniform film thickness. Moreover, a second electrode (cathode) 1116 is formed over the layer containing an organic compound 1115. As the cathode, a material having a small work function (Al, Ag, Li, or Ca; or an alloy of these elements such as MgAg, MgIn, AlLi, or CaF$_2$; or CaN) can be used. Here, in order to pass light, the second electrode (cathode) 1116 is made of a laminated layer of a metal thin film (MgAg: 10 nm in thickness) and a transparent conductive film (ITO (indium tin oxide), an indium oxide-zinc oxide alloy (In$_2$O$_3$—ZnO), zinc oxide (ZnO), or the like) having a film thickness of 110 nm. A light emitting element 1118 including the first electrode (anode) 1113, the layer containing an organic compound 1115, and the second electrode (cathode) 1116 is thus formed. In this embodiment, the layer containing an organic compound 1115 is formed by sequentially stacking CuPc (20 nm in thickness), α-NPD (30 nm in thickness), CBP including organometallic complexes (Pt (ppy)acac) using platinum as a central metal (30 nm in thickness), BCP (20 nm in thickness), and BCP: Li (40 nm in thickness) to obtain white emission. The organometallic complex using platinum as a central metal has a planar structure, and a plane thereof is preferably oriented to be perpendicular to a plane of the first electrode. According to the method described in any one of Embodiment Modes 2 to 6, organic compound materials in at least one layer of the layer containing an organic compound 1115 may be oriented by using other organic compound materials.

Since the light emitting element 1118 is given as an example of exhibiting white emission in this embodiment, a color filter comprising a coloring layer 1131 and a light shielding layer (BM) 1132 is provided (for simplification, an over coat layer is not illustrated).

Further, optical films 1140 and 1141 are provided for such dual emission display devices so as not to be transparent to see a background therethrough and so as not to reflect outside light. For the optical films 1140 and 1141, a polarizing film (a highly transmissive polarizing plate, a thin type polarizing plate, a paper white polarizing plate, a high-performance dye type polarizing plate, an AR polarizing plate, or the like), a retardation film (a broadband quarter-wave plate, a temperature compensating retardation film, a twisted-nematic retarder film, a wide viewing angle polarizing film, a biaxial oriented retardation film, or the like), a brightness enhancement film, and the like may appropriately be used in combination. For example, effect of preventing the device from being transparent to see a background therethrough and from reflecting light can be obtained by using polarizing films as the optical films 1140 and 1141 and arranging the polarizing films so that polarizing directions of light are perpendicular to each other. In this case, a portion except a light emitting portion for performing a display becomes black not to be transparent to see a background, even if the display is watched from either side. Since light emitted from a light emitting panel passes through only one polarizing plate, an image is displayed as it is.

Note that similar effect can be obtained without making two polarizing films perpendicular to each other when polarizing directions of light are within ±45°, preferably ±20°.

The optical films 1140 and 1141 can prevent a display from being hard to be recognized due to transparency to see a background when watched from one side.

Further, one more optical film may be added. For example, although either of the two polarizing films absorbs an S wave (or a P wave), a brightness enhancement film that reflects an S wave (or a P wave) to a light emitting element side and reuses the S wave may be provided between a polarizing plate and a light emitting panel. Consequently, more P wave (or S wave) passes through the polarizing plate, and a total amount of light increases. In a dual emission panel, since structures of layers through which light passes from a light emitting element are different, conditions of light (luminance, color purity, or the like) are also different. The optical film is useful for adjusting balance of light emission on both sides. In addition, since degrees of reflection of outside light are different in a dual emission panel, a brightness enhancement film is preferably disposed between a polarizing plate and a light emitting panel on a more reflective side.

In order to seal the light emitting element 1118, a transparent protective laminated layer 1117 is formed. The transparent protective laminated layer 1117 includes a first inorganic insulating film, a stress relaxation film, and a second inorganic insulating film. As the first inorganic insulating film and the second inorganic insulating film, a silicon nitride film, a silicon oxide film, a silicon oxynitride film (a SiNO film (composition ratio: N>O) or a SiON film (composition ratio: N<O)), or a thin film containing carbon as its main component (for example, a DLC film or a CN film) can be used. These inorganic insulating films have high blocking properties against moisture. However, when the film thickness is increased, film stress is also increased; consequently, film peeling easily occurs. By interposing the stress relaxation film between the first inorganic insulating film and the second inorganic insulating film, moisture can be absorbed and stress can be relaxed. Even when fine holes (such as pin holes) are formed on the first inorganic insulating film at film formation for any reason, the stress relaxation film can fill in the fine holes. The second inorganic insulating film formed over the stress relaxation film gives the transparent protective laminated film excellent blocking properties against moisture or oxygen. The stress relaxation film is preferably made of a material having smaller stress than that of an inorganic insulating film and hygroscopic properties. In addition, a material that is transparent to light is preferable. As the stress relaxation film, a material film containing an organic compound such as α-NPD (4,4'-bis[N-(1-naphthyl)-N-phenyl-amino]-biphenyl), BCP (bathocuproin), MTDATA (4,4',4"-tris(N-3-methylphenyl-N-phenyl-amino)-triphenyl amine), Alq$_3$ (tris-8-quinolinolate aluminum complex), or the like can be used. These films have hygroscopic properties and are almost transparent in case of having thin film thickness. Further, MgO, SrO$_2$, or SrO can be used as the stress relaxation film since they have hygroscopic properties and light transparency/translucency, and can be formed into a thin film by vapor deposition. In this embodiment, a silicon nitride film having high blocking properties against impurities such as moisture or alkaline metals is formed by vapor deposition using a silicon target in the atmosphere containing nitrogen and argon as the first inorganic insulating film or the second inorganic insulating film. A thin film made of Alq$_3$ by vapor deposition is used as the stress relaxation film. In order to pass light through the transparent protective laminated layer, the total film thickness of the transparent protective laminated layer is preferably formed to be as thin as possible.

In order to seal the light emitting element 1118, the sealing substrate 1104 is pasted with the use of the first sealing agent 1105 and the second sealing agent 1107 in an inert gas atmosphere. An epoxy resin is preferably used for the first sealing agent 1105. There is no particular limitation of a material for the second sealing agent 1107 as long as the material has light transparency/translucency. Typically, an ultraviolet curable or heat curable epoxy resin is preferably used. A highly heat resistant UV epoxy resin (product name: 2500 Clear, manufactured by Electrolite Cooperation) having an index of refraction equal to 1.50, a viscosity equal to 500 cps, a Shore D hardness equal to 90, a tensile strength equal to 3,000 psi, a Tg point of 150° C., a volumetric resistivity equal to $1\times10^{15}$ Ω·cm, and a withstand voltage of 450 V/mil is used here. Total transmittance can be improved by filling a space between a pair of substrates with the second sealing agent 1107, compared to a case where the space between the pair of the substrates is an open space (innert gas). It is preferable that the first sealing agent 1105 and the second sealing agent 1107 are materials that shields as much moisture or oxygen as possible.

In this embodiment, as a material for the sealing substrate 1104, a plastic substrate made of FRP (Fiberglass-Reinforced Plastics), PVF (polyvinyl fluoride), Myler, polyester, acrylic, or the like can be used besides a glass substrate or a quartz substrate. After pasting the sealing substrate 1104 with the first sealing agent 1105 and the second sealing agent 1107, a third sealing agent can be provided to seal the side face (exposed face).

By encapsulating the light emitting element 1118 in the first sealing agent 1105 and the second sealing agent 1107, the light emitting element 1118 can be shielded completely from outside to prevent moisture or oxygen that brings deterioration of the organic compound layer from penetrating into the light emitting element 1118. Therefore, a highly reliable light emitting device can be obtained.

When a top emission light emitting device is manufactured, an anode is preferably a metal film having reflectivity (chromium, titanium nitride, or the like). When a bottom emission light emitting device is manufactured, a cathode is preferably a metal film (from 50 nm to 200 nm in thickness) containing Al, Ag, Li, or Ca or an alloy of these elements MgAg, MgIn, or AlLi.

This embodiment can be freely combined with any one of Embodiment modes 1 to 6.

Embodiment 2

In this embodiment, another example of a different sealing method from that in Embodiment 1 is described with reference to FIG. 8. An example of white emission is described in Embodiment 1; however, an example of a light emitting device which can display in full color by providing three types (R, G, and B) of light emitting elements is described in this embodiment.

Figure 8:
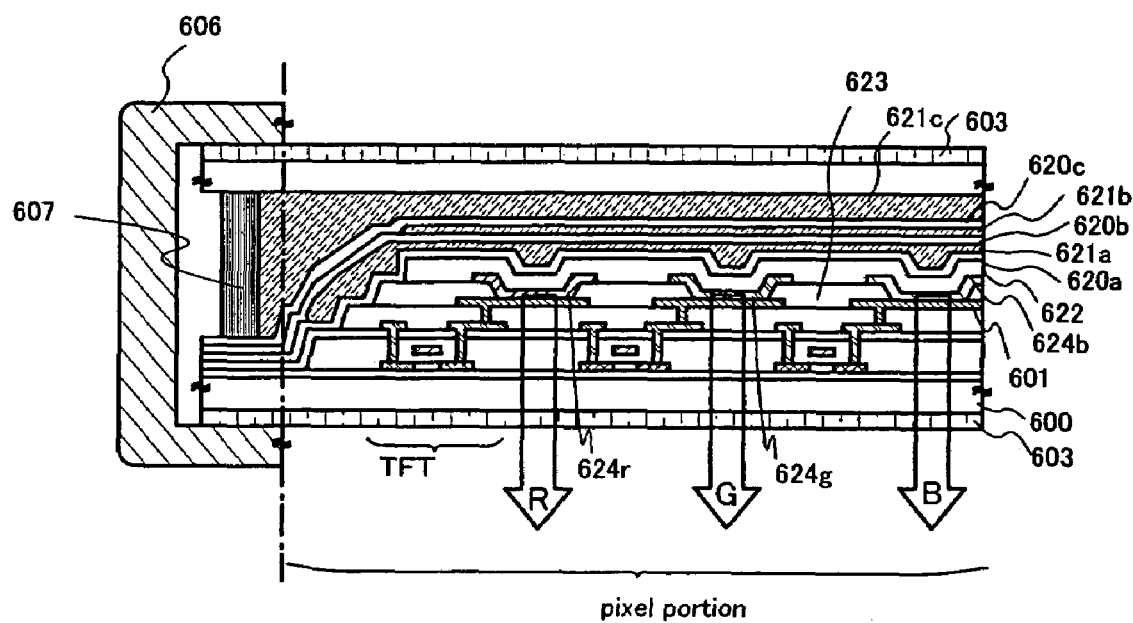
FIG. 8 shows a structure of an active matrix EL display device (Embodiment 2)

As shown in FIG. 8, an inorganic insulating layer 620b may be formed by sputtering over a sealing layer 621a after forming the sealing layer 621a by application and solidifying the sealing layer in order to further firmly seal a light emitting element covered with an inorganic insulating layer 620a. In addition, a sealing layer 621b may again be formed thereon by application and be solidified. Moisture or an impurity particularly from a side of a panel is shielded with a laminated layer of the sealing layer and the inorganic insulating film.

In FIG. 8, reference numeral 600 denotes a substrate; 601, a transparent electrode; 603, a polarizing plate; 606, a cover; 607, a sealing agent (containing a gap agent); 620a to 620c, inorganic insulating layers (a silicon nitride film (SiN), a silicon oxynitride film (SiNO), an aluminum nitride film (AlN), an aluminum nitride oxide film (AlNO), or the like); 621a to 621c, sealing layers; 622, a transparent electrode; 623, a partition (also referred to as a bank). Further, reference numeral 624b denotes an EL layer which exhibits blue emission as a light emitting element; 624g, an EL layer which exhibits green emission as a light emitting element; 624r, an EL layer which exhibits red emission as a light emitting element. Accordingly, a full color display is realized. The transparent electrode 601 is an anode (or a cathode) of a light emitting element connected to a source electrode or a drain electrode of a TFT.

This embodiment can be freely combined with any one of Embodiment Modes 1 to 6 and Embodiment 1.

Embodiment 3

In this embodiment, examples of electronic appliances having two or more display devices are described with reference to FIGS. 9A to 9G. Electronic appliances comprising an EL module can be completed by implementing the present invention. Such electric appliances are as follows: a video camera; a digital camera; a goggle type display (head mounted display); a navigation system; audio reproducing devices (a car audio, an audio component, and the like); a laptop computer; a game machine; personal digital assistants (a mobile computer, a cellular phone, a portable game machine, an electronic book, and the like); and an image reproducing device including a recording medium (specifically, a device capable of processing data in a recording medium such as a Digital Versatile Disk (DVD) and having a display that can display the image of the data).

Figure 9A:
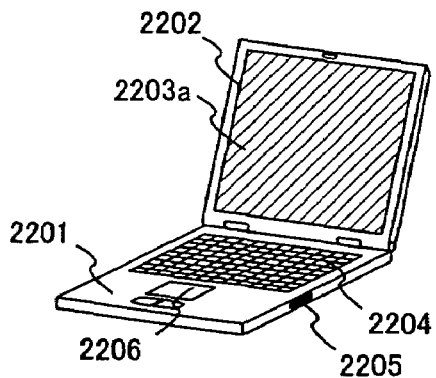
Figure 9A:
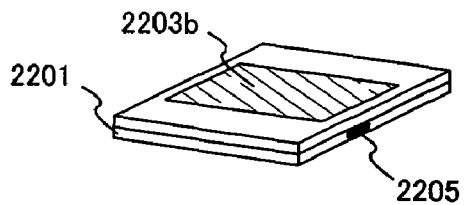
Figure 9A:
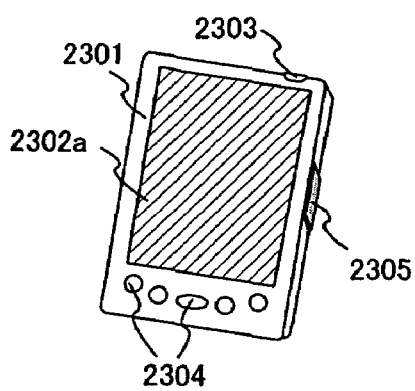
Figure 9A:
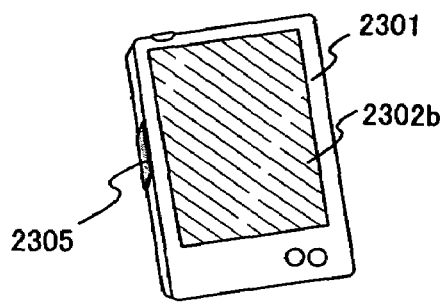

FIG. 9A is a perspective view of a laptop computer, and FIG. 9B is a perspective view showing a folded state of the laptop computer. The laptop computer comprises a main body 2201, a casing 2202, display portions 2203a and 2203b, a keyboard 2204, an external connection port 2205, a pointing mouse 2206, and the like.

The laptop computer shown in FIGS. 9A and 9B comprises a high-resolution display portion 2203a that mainly displays an image in full color and a display portion 2203b that mainly displays characters and symbols in monochrome.

FIG. 9C is a perspective view of a mobile computer, and FIG. 9D is a perspective view showing a back side. The mobile computer comprises a main body 2301, display portions 2302a and 2302b, a switch 2303, operation keys 2304, an infrared port 2305, and the like. The mobile computer comprises a high-resolution display portion 2302a that mainly displays an image in full color and a display portion 2302b that mainly displays characters and symbols in monochrome.

Figure 9E:
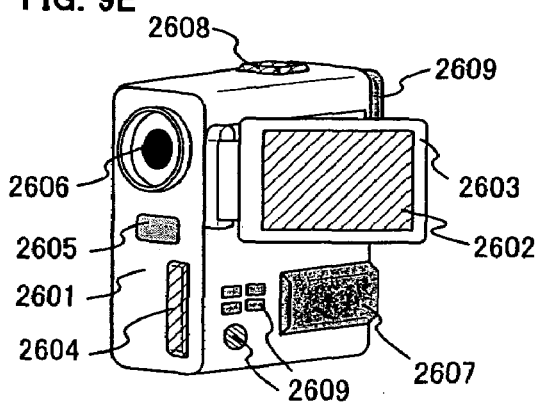

FIG. 9E shows a video camera, which comprises a main body 2601, a display portion 2602, a casing 2603, an external connection port 2604, a remote control receiving unit 2605, an image receiving unit 2606, a battery 2607, an audio input section 2608, operation keys 2609, and the like. The display portion 2602 is a dual emission panel, which can mainly display a high-quality image in full color on one side and can mainly display characters and symbols in monochrome on the other side. Note that the display portion 2602 can be turned at an attaching portion. The present invention can be applied to the display portion 2602.

Figure 9F:
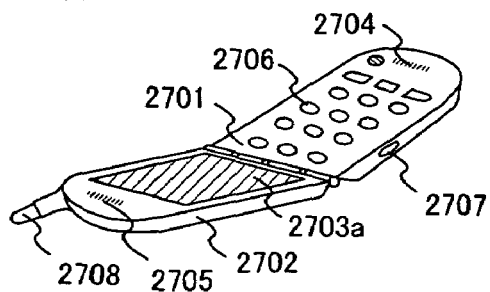
Figure 9F:
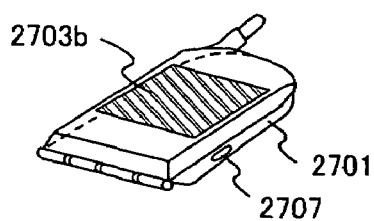

FIG. 9F is a perspective view of a cellular phone, and FIG. 9G is a perspective view showing a folded state of the cellular phone. The cellular phone comprises a main body 2701, a casing 2702, display portions 2703a and 2703b, an audio input section 2704, an audio output section 2705, operation keys 2706, an external connection port 2707, an antenna 2708, and the like.

The cellular phone shown in FIGS. 9F and 9G comprises a high-resolution display portion 2703a that mainly displays an image in full color and an area color display portion 2703*b* that mainly displays characters and symbols. In this case, a color filter is used for the display portion 2703*a*, and an optical film for a display in area color is used for the display portion 2703*b*.

This embodiment can freely be combined with any one of Embodiment Modes 1 to 6 and Embodiments 1 and 2.

According to the present invention, current efficiency-luminance characteristics can be improved by orienting organic compound molecules in an applying direction of current. In addition, deterioration can be prevented by using a crystallization inhibitor.

This application is based on Japanese Patent Application serial no. 2003-133950 filed in Japanese Patent Office on May 13 in 2003, the contents of which are hereby incorporated by reference.

Although the present invention has been fully described by way of example with reference to the accompanying drawings, it is to be understood that various changes and modifications depart from the scope of the present invention hereinafter defined, they should be construed as being included therein.

What is claimed is:

1. A light emitting device comprising a plurality of EL elements, each EL element comprising:
   a cathode;
   an anode; and
   an EL layer containing an organic compound between the cathode and the anode,
   wherein the organic compound has a metal carboxylate group, and
   wherein molecules of the organic compound are oriented in one direction.

2. A light emitting device according to claim 1, wherein the EL element emits light selected from the group consisting of red, green, and blue.

3. A light emitting device according to claim 1, wherein each of the plurality of EL elements emits light having a color selected from the group consisting of red, green, blue, and white.

4. An electronic appliance comprising the light emitting device according to claim 1, wherein the electronic appliance is one selected from the group consisting of a video camera, a car navigation system, a personal computer, and a handheld terminal.

5. A light emitting device comprising a plurality of EL elements, each EL element comprising:
   a cathode;
   an anode; and
   an EL layer containing an organic compound between the anode and cathode,
   wherein the organic compound has a metal carboxylate group, and
   wherein a molecular chain of a molecule of the organic compound is oriented in the same direction as current flowing between the cathode and the anode.

6. A light emitting device according to claim 5, wherein the EL element emits light selected from the group consisting of red, green, and blue.

7. A light emitting device according to claim 5, wherein each of the plurality of EL elements emits light having a color selected from the group consisting of red, green, blue, and white.

8. An electronic appliance comprising the light emitting device according to claim 5, wherein the electronic appliance is one selected from the group consisting of a video camera, a car navigation system, a personal computer, and a handheld terminal.

9. A light emitting device comprising a plurality of EL elements, each EL element comprising:
   a cathode;
   an anode; and
   an EL layer containing an organic compound between the anode and cathode,
   wherein the organic compound has a metal carboxylate group,
   wherein molecular chains of molecules of the organic compound are continuously oriented in the same direction as current flowing between the cathode and the anode, and
   wherein a material for inhibiting crystallization of the organic compound is disposed among the molecules.

10. A light emitting device according to claim 9, wherein the EL element emits light selected from the group consisting of red, green, and blue.

11. A light emitting device according to claim 9, wherein each of the plurality of EL elements emits light having a color selected from the group consisting of red, green, blue, and white.

12. An electronic appliance comprising the light emitting device according to claim 9, wherein the electronic appliance is one selected from the group consisting of a video camera, a car navigation system, a personal computer, and a handheld terminal.

13. A light emitting device comprising a plurality of EL elements, each EL element comprising:
   a cathode;
   an anode; and
   an EL layer containing an organic compound between the anode and the cathode,
   wherein the organic compound has a metal carboxylate group, and
   wherein one of the anode and the cathode has regular depressions and projections on its surface, and
   wherein molecules of the organic compound are oriented along the regular depressions and the projections.

14. A light emitting device according to claim 13, wherein the EL element emits light selected from the group consisting of red, green, and blue.

15. A light emitting device according to claim 13, wherein each of the plurality of EL elements emits light having a color selected from the group consisting of red, green, blue, and white.

16. An electronic appliance comprising the light emitting device according to claim 13, wherein the electronic appliance is one selected from the group consisting of a video camera, a car navigation system, a personal computer, and a handheld terminal.

17. A light emitting device comprising a plurality of EL elements, each EL element comprising:
   a cathode;
   an anode; and
   an EL layer containing an organic compound between the anode and the cathode,
   wherein the EL layer containing the organic compound has a laminate structure comprising:
     a first layer containing a first organic compound having a metal carboxylate group; and
     a second layer containing a second organic compound over the first layer,
   wherein the first layer containing the first organic compound has regular depressions and projections on its surface, and
   wherein molecules of the second organic compound are arranged along the regular depressions and the projections.

18. A light emitting device according to claim 17, wherein the EL element emits light selected from the group consisting of red, green, and blue.

19. A light emitting device according to claim 17, wherein each of the plurality of EL elements emits light having a color selected from the group consisting of red, green, blue, and white.

20. An electronic appliance comprising the light emitting device according to claim 17, wherein the electronic appliance is one selected from the group consisting of a video camera, a car navigation system, a personal computer, and a handheld terminal.

* * * * *